United States Patent
Chase et al.

(10) Patent No.: US 6,813,053 B1
(45) Date of Patent: Nov. 2, 2004

(54) APPARATUS AND METHOD FOR CONTROLLED CANTILEVER MOTION THROUGH TORSIONAL BEAMS AND A COUNTERWEIGHT

(75) Inventors: Steven M. Chase, Baltimore, MD (US); Connie J. Chang-Hasnain, Palo Alto, CA (US); Jeffrey Michael Waite, Austin, TX (US)

(73) Assignee: The Regents of the University of California, Oakland, CA (US)

(*) Notice: Subject to any disclaimer, the term of this patent is extended or adjusted under 35 U.S.C. 154(b) by 321 days.

(21) Appl. No.: 09/693,612

(22) Filed: Oct. 20, 2000

Related U.S. Application Data
(60) Provisional application No. 60/205,967, filed on May 19, 2000.

(51) Int. Cl.[7] .................. G02B 7/182; G02B 26/00; H01S 3/00
(52) U.S. Cl. .................. 359/223; 359/225; 359/346; 359/578; 359/872; 359/900; 372/32; 372/99; 372/107; 250/234
(58) Field of Search .................. 359/223, 224, 359/225, 872, 333, 346, 578, 579, 900; 372/20, 32, 99, 107; 250/234

(56) References Cited
U.S. PATENT DOCUMENTS

| | | | |
|---|---|---|---|
| 3,600,798 A | | 8/1971 | Lee |
| 3,886,310 A | | 5/1975 | Guldberg |
| 3,896,338 A | | 7/1975 | Nathanson et al. |
| 4,196,972 A | * | 4/1980 | Rawlings |
| 4,229,732 A | | 10/1980 | Hartstein et al. |
| 4,710,732 A | | 12/1987 | Hornbeck |
| 5,115,351 A | * | 5/1992 | Miyawaki et al. |
| 5,115,354 A | * | 5/1992 | Iwase |
| 5,212,582 A | * | 5/1993 | Nelson ........................ 359/224 |
| 5,485,304 A | * | 1/1996 | Kaeriyama .................. 359/224 |
| 5,535,047 A | * | 7/1996 | Hornbeck .................... 359/224 |
| 5,629,951 A | * | 5/1997 | Chang-Hasnain et al. |
| 5,631,782 A | * | 5/1997 | Smith et al. ................ 359/872 |
| 5,719,695 A | * | 2/1998 | Heimbuch |
| 5,760,947 A | | 6/1998 | Kim et al. |
| 5,771,253 A | * | 6/1998 | Chang-Hasnain et al. |
| 6,000,280 A | * | 12/1999 | Miller et al. |
| 6,074,890 A | * | 6/2000 | Yao et al. |
| 6,236,139 B1 | * | 5/2001 | Hill et al. |
| 6,275,320 B1 | * | 8/2001 | Dhuler et al. |
| 6,463,085 B1 | * | 10/2002 | Tayebati |

FOREIGN PATENT DOCUMENTS
WO   PCT/US01/15545   5/2001

OTHER PUBLICATIONS
Waite, Jeffrey Michael. *"Design and Properties of a Torsional Micromechanical Tunable Optic Fiber"*, Master of Science Thesis, U.C. Berkeley, Fall 2000, pp 1–55.

* cited by examiner

Primary Examiner—Ricky D. Shafer
(74) Attorney, Agent, or Firm—John P. O'Banion

(57) ABSTRACT

An optical micro-electromechanical device includes a substrate and a mirror assembly suspended above the substrate. The mirror assembly includes a torsional beam and a cantilever. The cantilever includes a cantilever first end and a cantilever second end. The cantilever first end is attached to the torsional beam. The cantilever second end supports a mirror head. A connector is attached to the torsional beam. A counterweight is attached to the connector.

28 Claims, 8 Drawing Sheets

|  | A | B | C | D | E | F |
|---|---|---|---|---|---|---|
| mw, cw | 5 | 3 | 5 | 5 | 5 | 3 |
| ml | 150 | 210 | 150 | 150 | 185 | 200 |
| cl | 100 | 90 | 100 | 100 | 80 | 90 |
| bl | 30 | 30 | 39 | 44 | 44 | 44 |
| conn_w | 25 | 15 | 42 | 45 | 13 | 13 |
| conn_l | 40 | 35 | 40 | 40 | 40 | 30 |
| Etch Holes | None | None | 15x30, t-hole | 20x30, t-hole | 20x30, no t-hole | 20x30, no t-hole |
| Twist | 1.418 | 2.350 | 1.200 | 1.160 | 1.231 | 2.075 |

FIG. 8

APPARATUS AND METHOD FOR CONTROLLED CANTILEVER MOTION THROUGH TORSIONAL BEAMS AND A COUNTERWEIGHT

This application claims priority to the U.S. Provisional Patent Application entitled, "Vertical Cavity Filter with Torsional Beam Mounted Mirror, and Method of Forming Same", Ser. No. 60/205,967, filed May 19, 2000.

This invention was made with Government support under Grant (Contact) No. ECS-9800341, awarded by the National Science Foundation. The Government has certain rights to this invention.

BRIEF DESCRIPTION OF THE INVENTION

This invention relates generally to micro-electromechanical devices. More particularly, this invention relates to a micro-electromechanical cantilever whose motion is controlled by torsional beams and a counterweight.

BACKGROUND OF THE INVENTION

Micromachines (also called micromechanical devices or micro-electromechanical devices) are small (micron scale) machines that promise to miniaturize instrumentation in the same way microelectronics have miniaturized electronic circuits. As used herein, the term micromachine refers to any three-dimensional object having one or more sub-millimeter dimensions formed using semiconductor processing techniques.

One form of micromachine is a cantilever. Cantilevers are widely used in scanning electronic microscopes. Recently, cantilevers have been incorporated into vertical cavity optical structures. Vertical cavity optical structures offer the advantages of single longitudinal mode operation, batch processing, two-dimensional array formation and cylindrical symmetry. The cavity length of such devices is small enough to allow for continuous tuning, rather than discrete mode hoping.

One type of vertical cavity optical structure is the vertical-cavity surface-emitting laser (VCSEL). VCSELs are used as light sources in a variety of electronic applications including fiber optic communications, laser printing, and optical data storage.

A VCSEL is an injection diode laser where the laser oscillation and output occur normal to a semiconductor pn junction plane. In edge-emitting laser diodes, the laser oscillation and output occur along the semiconductor pn junction. VCSELs have many advantages compared to edge-emitting laser diodes. These advantages include a low divergence circular output, single longitudinal mode operation, and high two-dimensional packing density.

In view of these advantages, there are ongoing efforts to utilize vertical cavity optical structures to replace bulk optical components. In comparison to bulk optical components, vertical cavity optical structures offer the advantages of lower cost, power and size.

One problem with current vertical cavity optical structures is tuning range. The tuning range of existing tunable vertical cavity structures is limited by the range of movement available in electrostatically actuated cantilevers. It would be highly desirable to extend the tunable range of the cantilever structure. Another problem with prior art vertical cavity optical structures utilizing cantilevers or multiply supported structures is that they collide with the device substrate upon reaching a bias point instability.

Overcoming these prior art problems associated with vertical cavity optical structures would facilitate their use in evolving commercial applications. For example, the growing demand for telecommunications bandwidth requires improved fiber optic communication links. Improved fiber optic communication links will enable technologies such as Dense Wavelength Division Multiplexing.

In view of the foregoing, it would be highly desirable to provide an improved vertical cavity optical structure with increased cantilever actuation range. Ideally, such a device would mitigate the problem of a cantilever colliding with its underlying substrate.

SUMMARY OF THE INVENTION

The invention includes an optical micro-electromechanical device. The optical micro-electromechanical device includes a substrate and a mirror assembly suspended above the substrate. The mirror assembly includes a torsional beam and a cantilever. The cantilever includes a cantilever first end and a cantilever second end. The cantilever first end is attached to the torsional beam. The cantilever second end supports a mirror head. A connector is attached to the torsional beam. A counterweight is attached to the connector.

The invention also includes a method of operating an optical micro-electromechanical device. The method includes the step of positioning a mirror assembly over a substrate, where the mirror assembly includes a torsional beam attached to the substrate, a cantilever with a cantilever first end and a cantilever second end, the cantilever first end being attached to the torsional beam, and the cantilever second end supporting a mirror head. A connector is attached to the torsional beam and a counterweight is attached to the connector. An electrical bias is applied to the substrate to create an electrostatic attraction between the counterweight and the substrate, which causes the torsional beam to rotate and thereby re-reposition the mirror head.

The invention provides an improved vertical cavity optical structure with increased cantilever actuation range. The vertical cavity optical structure can be operated as a laser, a detector, or a filter. The structure allows one to create a red-shift of filter wavelength and a blue-shift of filter wavelength. The device mitigates the problem of a cantilever colliding with its underlying substrate through the use of an isolation region, which may be implemented as an electrical isolation region through doping, through a passivation surface, or through spatial isolation. A counterweight configured with apertures facilitates fabrication.

BRIEF DESCRIPTION OF THE DRAWINGS

For a better understanding of the invention, reference should be made to the following detailed description taken in conjunction with the accompanying drawings, in which:

FIG. 8 illustrates parameters associated with different embodiments of the invention.

Like reference numerals refer to corresponding parts throughout the drawings.

DETAILED DESCRIPTION OF THE INVENTION

Figure 1:
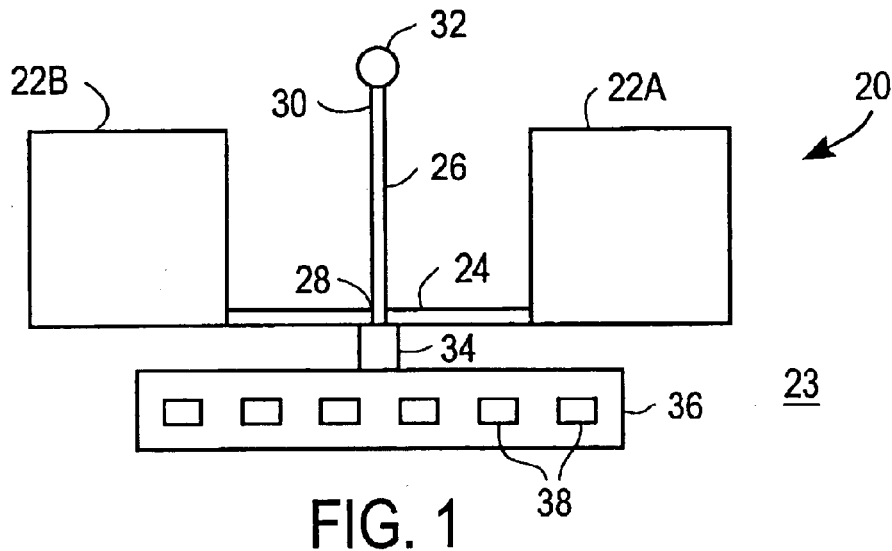
FIG. 1 is a top view of an optical micro-electromechanical device formed in accordance with an embodiment of the invention.

FIG. 1 is a top view of an optical micro-electromechanical device 20 formed in accordance with an embodiment of the invention. The device 20 includes a set of contacts 22A–22B that are attached to a substrate 23. As shown below, the contacts rise from the substrate 23. As shown below, the remaining components of FIG. 1 are suspended over the substrate 23. In particular, a torsional beam 24 is attached between the contacts 22A–22B.

A cantilever 26 with a first end 28 is attached to the torsional beam 24. A second end 30 of the cantilever 26 supports a mirror head 32. The cantilever 26 has a mirrored surface on its underside, which faces the substrate 23. A parallel mirror is formed on the substrate 23 underneath the cantilever 26, as shown below. Thus, the structure of the invention forms a Fabry-Perot cavity with two mirrors separated by an air gap.

A connector 34 is also attached to the torsional beam 24. A counterweight 36 is attached to the connector 34. The counterweight 36 includes one or more apertures 38. As discussed below, the apertures 38 facilitate the fabrication process.

A controlled electrical bias is applied to the contacts 22A–22B, causing an electrostatic attraction between the substrate 23 and the suspended components of the device 20. In particular, the relative size and mass of the counterweight 36 cause it to be attracted to the substrate 23. This causes a twisting motion in the torsional beam 24, resulting in controlled movement of the mirror head 32.

Figure 2:
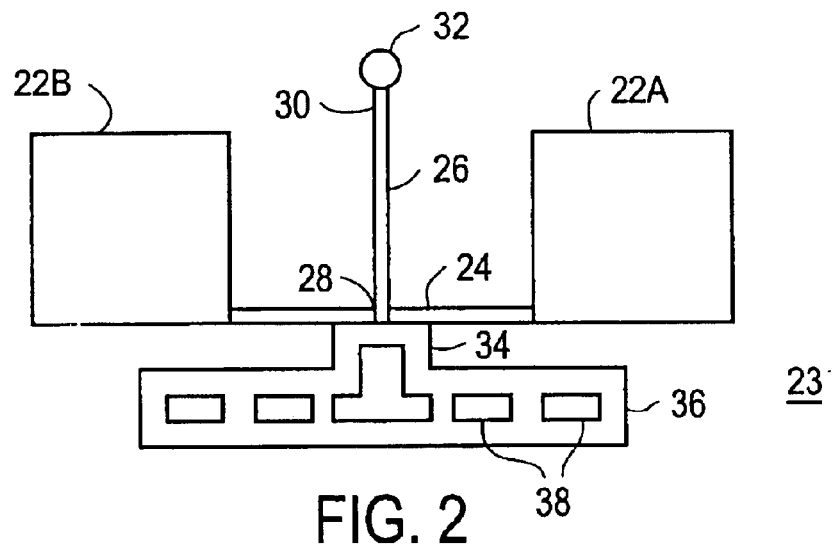
FIG. 2 is a top view of an optical micro-electromechanical device formed in accordance with another embodiment of the invention.

FIG. 2 illustrates another embodiment of the invention. The apparatus of FIG. 2 generally corresponds to the apparatus of FIG. 1. However, in the case of the apparatus of FIG. 2, the apertures 38 have a different configuration. In addition, the connector 34 has a different configuration.

Figure 3:
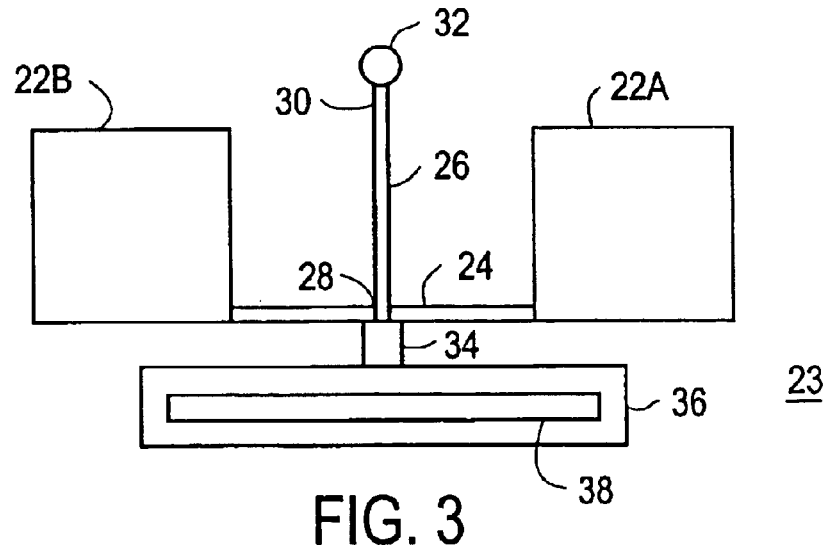
FIG. 3 is a top view of an optical micro-electromechanical device formed in accordance with still another embodiment of the invention.

FIG. 3 illustrates still another embodiment of the invention. The apparatus of FIG. 3 generally corresponds to the apparatus of FIG. 1. However, the apparatus of FIG. 3 has only a single aperture 38. Those skilled in the art will recognize that multiple alternate configurations are also conceivable in accordance with the invention.

The optical micro-electromechanical device of the invention has a number of advantages over prior art devices. The structure of the invention can be used to create a red-shifting tunable vertical cavity filter. The device can be used to create devices that extend the cavity tuning range beyond that which was previously possible. This feature has important applications in achieving widely tunable devices such as lasers, detectors, and filters. Increasing the tuning range of these devices facilitates fiber optic communication networks with increased bandwidth and reduced cost. The invention includes optimized fabrication techniques to construct the disclosed apparatus.

Figure 4:
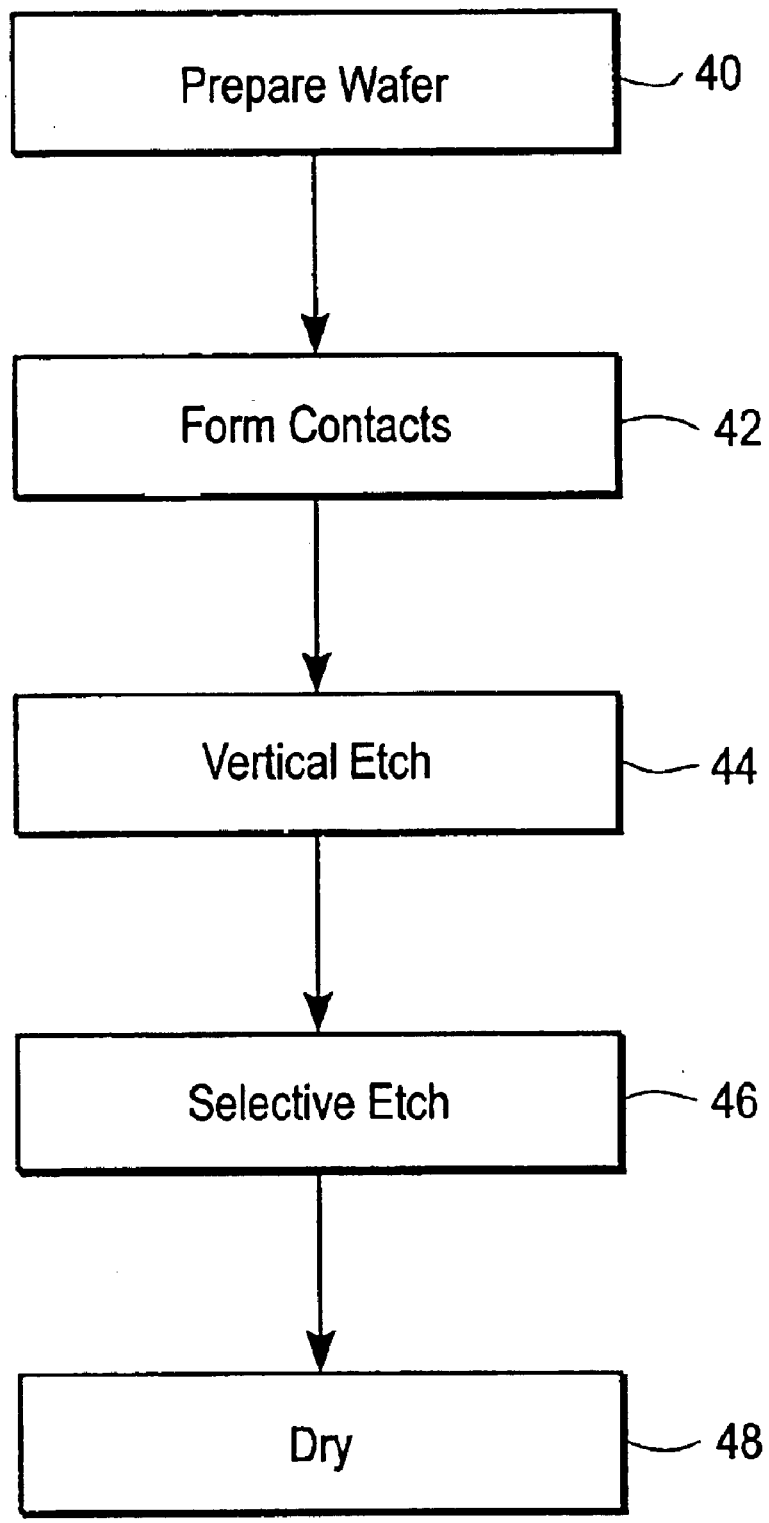
FIG. 4 illustrates processing steps used to form an optical micro-electromechanical device of the invention.

Attention presently turns to different fabrication techniques that may be used to construct devices in accordance with the invention. FIG. 4 illustrates processing steps associated with one fabrication sequence that may be used in accordance with the invention. FIG. 4 initially illustrates the step of preparing a wafer (step 40). Afterwards, the contacts 22 are formed (step 42). Thereafter, a vertical etch is performed (step 44) to define structural features of the suspended components of the apparatus 20. A selective etch is then performed (step 46) to remove sacrificial regions in order to create suspended components of the apparatus 20. The wafer is then dried (step 48). This fabrication sequence is more fully appreciated in connection with the following discussion, which provides a detailed discussion of each processing step.

As previously indicated, the initial processing step is to prepare the wafer (step 40). Different types of wafers that may be used in accordance with the invention are discussed below. After a wafer is selected, a 10:1 Buffered Oxide Etch may be used for ten seconds to remove oxidation. The sample can then be sprayed with deionized water, acetone and isopropyl alcohol. Initial drying can be performed with an $N_2$ gun. Complete drying can be accomplished by baking the sample for five minutes at 90° C. Hexamethyldisilazane was then deposited on the sample for five minutes to improve photoresist adhesion to the surface.

After the foregoing wafer preparation operations, contacts are formed (step 42). Microposit S1818 photoresist was spun on the wafer at 4000 rpm for thirty seconds. The sample was then baked at 90° C. for five minutes before exposure in a mask aligner. The sample was developed in Microposit Developer Concentrate diluted 1:1 with deionized water for approximately 20 seconds. The sample was then rinsed in deionized water and dried with $N_2$. These operations open windows in the photoresist for contact deposition. Immediately before deposition, the sample is dipped into 10:1 Buffered Oxide Etch for five seconds and is dried with $N_2$. Then, an e-beam evaporator is used to coat the wafer with 200A of titanium followed by 2000A of gold. Lift-off is performed with acetone leaving only the contact pads 22 in place.

The next processing step is to perform a vertical etch (step 44). Approximately 2000A of silicon nitride is deposited over the entire surface of the wafer using a plasma-enhanced chemical vapor deposition system. A second mask is then used to define the device structure using the identical photolithographic process described above. The silicon nitride is then stripped using a $CF_4$ plasma etch in a Semi Group Reactive Ion Etcher TP1000. This left nearly vertical sidewalls on the remaining silicon nitride. The photoresist was then stripped with acetone, leaving only a silicon nitride mask for use in the remaining processing steps. A thin layer of nitride frequently peeled off with the photoresist during the strip. If the sample is soaked in acetone, this layer sticks to the surface and causes problems during the following etch. Therefore, it is important to spray the sample with acetone rather than soak the sample so that debris cannot stick. A silicon nitride mask is used because a photoresist mask reacts with etch gases and contaminates the reactive ion etch. Also, the photoresist becomes increasingly difficult to remove with increasing selective etch time.

An Oxford RIE 100 was used to vertically etch the wafer in $SiCl_4$ plasma until at least the sacrificial layer is exposed. This is done with $SiCl_4$ flowing at 20 sccm, a chamber pressure of 10 m Torr, forward RF power of 60 W and the platter cooled to 10° C. It is important that the platter not be heated during this step. A heated platter causes the etch to become more reactive and less mechanical, resulting in an undercutting of the etch mask and a compromised device shape.

Preferably, an in-situ monitored etch is performed. A trace of reflectometry may be used in real-time so that the total etch depth can be determined with accuracy. This system takes advantage of the varying indices of refraction caused by varying aluminum content. The variation of etch depth across a 1 cm$^2$ sample is approximately 8%. For etches that require more accuracy, dummy samples can be placed around the real sample during the etch to increase tolerance.

Figure 5A:
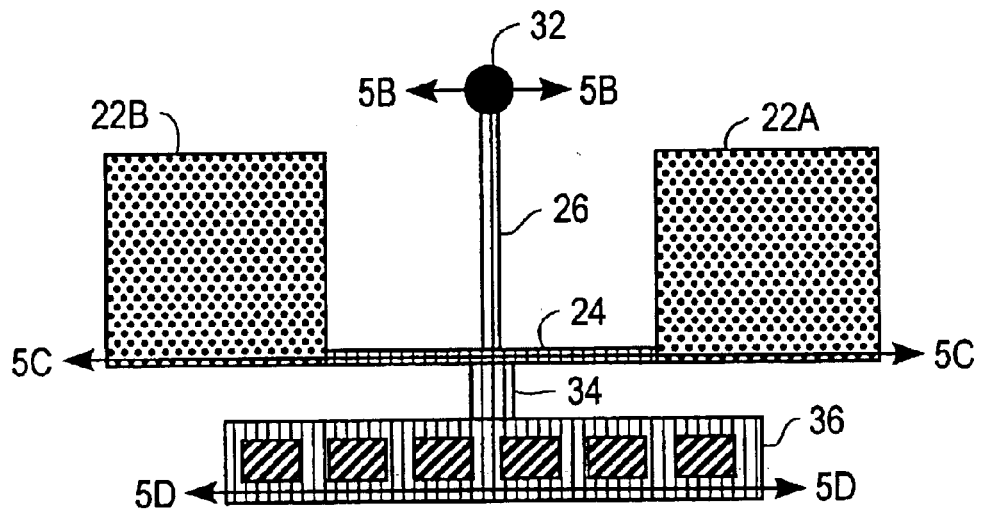
FIGS. 5A-5D illustrate an optical micro-electromechanical device of the invention during the fabrication process of FIG. 4.
Figure 5B:
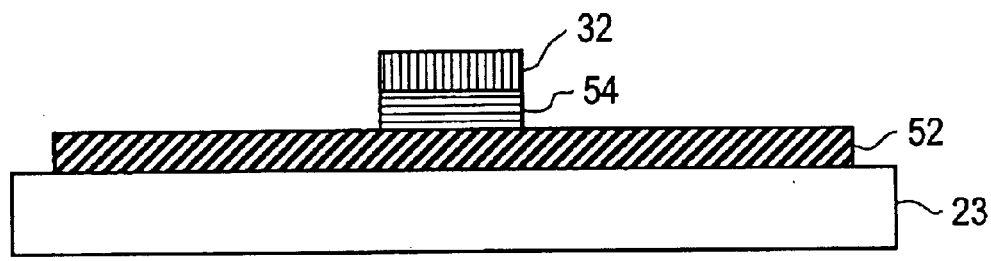

FIGS. 5A-5D illustrate the device after the vertical etch. FIG. 5A is a top view of the device. FIG. 5B is a side view of the mirror head taken along the line 5B—5B of FIG. 5A. The figure illustrates the mirror head 32 positioned on an intermediate layer 54, which in this example is GaAs. The figure also illustrates a bottom mirror 52 positioned on a substrate 23, which is also GaAs in this example.

Figure 5C:
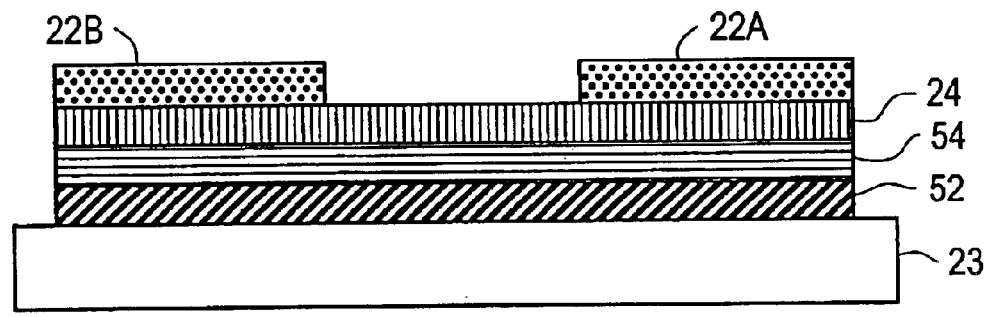
Figure 5D:
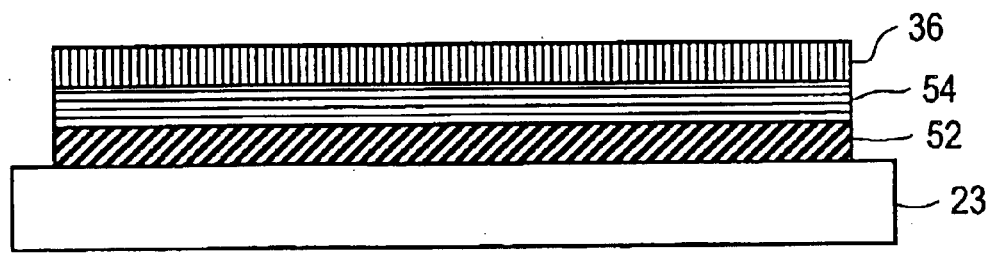

FIG. 5C is a side view of the torsional beam 24 taken along the line 5C—5C of FIG. 5A. Observe that at this processing point the torsional beam 24 is positioned on top of the intermediate layer 54. FIG 5D is a side view of the counterweight 36 taken along the line 5D—5D of FIG. 5A. At this processing point the counterweight 36 is on top of the intermediate layer 54.

Returning to FIG. 4, the next processing step is to selectively etch the wafer (step 46). This operation releases the device. The same reactive ion etch system was used for this etch as the vertical etch. The recipe calls for 20 sccm of $SiCl_4$ and 5–10 sccm of $SF_6$ at 75 m Torr, approximately 40 Watts, at 20° C. to 80° C. for 15–45 minutes. The key attribute of this etch is the undercut achieved. This is due to the presences of $SF_6$ ions, which react with aluminum in the crystal to form $AlF_3$. This passivates all layers with aluninum, while leaving the GaAs to be etched. This method can result in an extremely high, nearly unmeasurable, selectivity when aluminum content is greater than 20%.

Figure 6A:
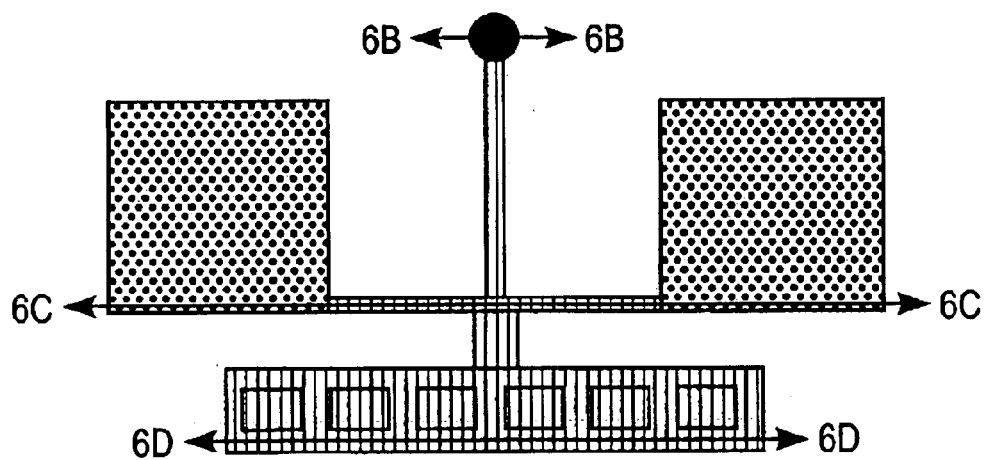
FIGS. 6A-6D illustrate an optical micro-electromechanical device of the invention during the fabrication process of FIG. 4.
Figure 6B:
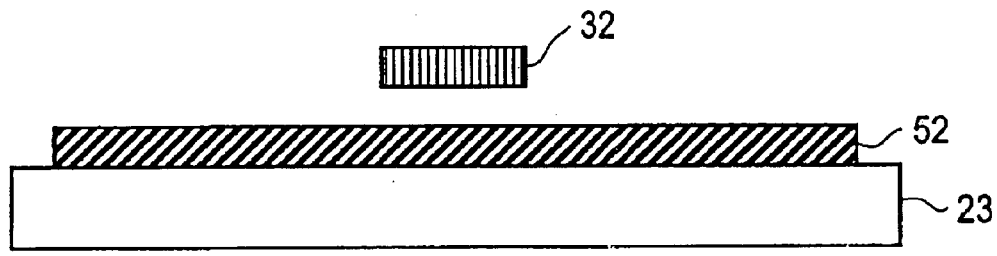
Figure 6C:
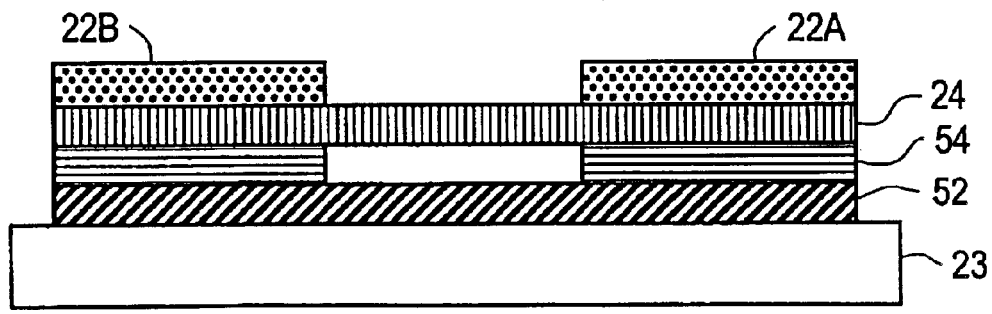
Figure 6D:
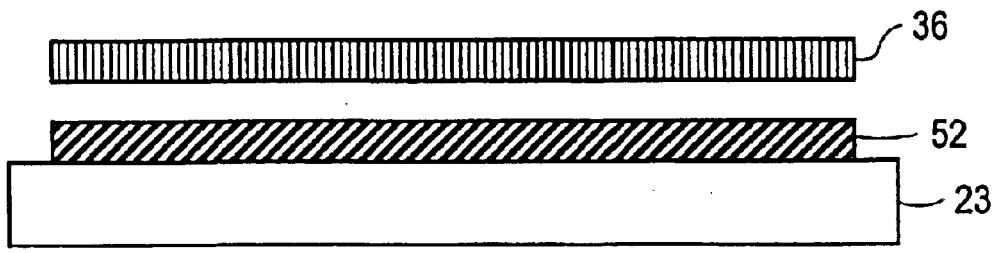

FIGS. 6A-6D illustrate the device after the selective etch. FIG. 6A is a top view of the device. FIG. 6B is a side view of the device taken along the line 6B—6B of FIG. 6A. FIG. 6B illustrates the mirror head 32 suspended over the substrate 23. FIG. 6C is a side view of the device taken along the line 6C—6C of FIG. 6A. The figure illustrates that the torsional beam 24 is attached to the contacts 22A–22B at its ends and is suspended over the substrate 23 at its center. FIG. 6D is a side view of the device taken along the line 6D—6D of FIG. 6A. The figure illustrates the counterweight 36 suspended over the substrate 23.

The etching operations associated with the fabrication of the device have now been described. Attention presently turns to etching optimizations that may be used in accordance with the invention. In the case of incomplete etching, where GaAs remains after removal of the sample from the reactive ion etch, the sample can be placed back into the reactive ion etch to complete etching. Pin-holing is another problem that needs to be avoided. Pin-holing describes the situation where the etch creates extremely small holes in the etch-stop layer, thereby exposing the underlying layers to whatever processes follow. If pin-holing occurs, a thicker etch-stop layer should be used. In addition, the layer directly beneath the etch-stop layer must be resistant to Buffered Oxide Etch.

Another problem to be addressed is redeposition. Redeposition describes material that is not GaAs being left over after the etch. It is a problem because it can restrict complete etching or prevent measurement by causing non-smooth mirror surfaces. Redeposition occurs primarily underneath the structure and only at certain points. It is typically worst underneath the head. Another trouble point is underneath the outside corners of the etch holes. The connector is usually the last piece to release. Gas flow is better under the areas with no redeposition. Redeposition is the limiting factor of the amount of undercut achievable because deposited materials block the etchant from reaching the GaAs.

Another problem to avoid is contact removal, which occurs when the etch time is too long. The material underneath the contact is GaAs, which can be attacked during the selective etch. To avoid this problem, the contacts should be made relatively larger to allow for over etching, while still maintaining adhesion to the substrate.

Attention now turns to several parameters associated with the selective etch that should be optimized. The gas mixture is an important consideration. The ratio of $SiCl_4$ to $SF_6$ will determine the selectivity of the etch. Increasing $SF_6$ makes the etch more selective but also leads to increased redeposition rate. Thus, a gas ratio should be selected to minimize $SF_6$, while providing the desired selectivity.

Gap size is the most important device design parameter in terms of selective etch quality. A larger gap improves selective etch quality. The invention was implemented with wafers having gaps of 0.8 µm, 1.2 µm, and 1.4 µm. With the 1.4 µm gap wafer it was relatively easy to find an etch recipe that did not leave any redeposited material. With the smaller gap wafer the etch was extremely difficult to optimize and obtaining a clean surface was rare. Too short of an etch resulted in unreleased devices, whereas only a few additional minutes of etching result in excessive redeposition. This makes timing of the etch critical and difficult. The required etch time is lower for larger gaps. It is believed that this is a result of improved etchant flow under the structure. If the gap is small, redeposition and pin-holing will occur. Another benefit of having a large gap is ease in unsticking devices that have slammed down during testing. The only clear drawback to having a larger gap is that contact removal occurs more often. Contact size needs to be increased to allow for less precise timing of the etch.

It is believed that redeposition occurs at a higher rate once the GaAs has been removed. Thus, minimizing etch time while still fully removing the GaAs is important for samples with small gaps. Etch time required is also fairly sensitive to the total sample size. The larger the sample, the longer the etch must be. For this reason it is important to make the samples uniform in size, and to attempt to make the range of acceptable values for etch time as wide as possible.

Etch quality is more sensitive to platter temperature than any other parameter. An undercut etch requires etched materials to be swept away from underneath the structure. Some etch products have low vapor pressures. By raising the platter temperature, one can increase the rate at which these materials are removed and allow fresh etchant to flow underneath the structure. In addition, higher temperature will also result in a much cleaner substrate away from devices. Since higher temperatures cause the etch to be more reactive, it is believed that at some temperature the etch will become less selective.

Etch quality increases with distance from the sacrificial layer to the surface of the sample as determined by the vertical etch depth. This is due to the gas flow dynamics at the surface of the sample. It is believed that the gas flow problems are caused by turbulent flow near the surface of the sample at the edges of the structure, which restricts flow underneath the structure. One solution to this problem is to make the sacrificial layer far away from the surface of the sample and the area of turbulent flow. This can be achieved by increasing the vertical etch depth. In a simple Fabry-Perot wafer the vertical etch can proceed through ¾ of the bottom $Al_{0.53}Ga_{0.47}As$ layer. Experiments show that this technique aids in selective etch rate and quality.

Oxford reactive ion etch chamber conditions are very important in this selective etch. Due to this, the etch can become erratic if the chamber is littered with unknown compounds. A dirty or contaminated chamber causes increased redeposition. To stabilize the chamber conditions, it is necessary to perform a bake-out of the system. This consists of heating the chamber to 80° C., the pumping throat to 60° C. and the platter to 60° C. for at least eight hours. In the meantime, an $O_2$ plasma etch should be performed at 200 mT with 30 sccm of $O_2$ at 200W for one hour. After this, the base pressure of the system should reach approximately $5 \times 10^{-7}$ Torr. The chamber should be pumped down to at least $8.5 \times 10^{-7}$ Torr after loading the sample, but before the etch. It is helpful to bake the sample at 90° C. for approximately five minutes before loading to drive off any water and lower pumping time.

Returning to FIG. 4, the final processing step is a drying operation (step 48). A critical point dryer may be used to release the structure. At the conclusion of the selective etch there is liquid etchant left on the sample which must be removed using Buffered Oxide Etch or methanol. Without an immediate clean, this liquid will permanently contaminate the surface of the sample as it evaporates. If the sample is post-clean dried using conventional methods, these liquids will draw the structure towards the substrate with liquid surface tension. The critical point dryer technique avoids this problem by transferring from the liquid to gas phase of $CO_2$ in a supercritical transition. Inside the critical point dryer chamber, the methanol is displaced with $CO_2$, pressure and temperature are adjusted to go around the critical point of 31.1° C. and 1073 psi, and the sample is removed dry and released. Before the drying step, the sample can be stored in methanol indefinitely. If the methanol dries, it is possible to simply replace the sample in methanol to re-release the structures.

A features of the invention is to provide an isolation region between the substrate and the mirror assembly. This isolation region can be implemented in a number of ways. For example, doping may be used, a passivation surface may be deposited on the substrate or mirror assembly, or a trench may be formed in the substrate to provide spatial isolation with the mirror assembly.

In one embodiment of the invention, the top half of the top mirror is doped, while the bottom half of the top mirror is undoped. This was done so that the operating voltages would be slightly higher. Another effect is that upon slamdown, the counterweight does not stick to the material below it nearly as much as did the devices with a fully doped top mirror. Often the device would slamdown but release immediately when the voltage was turned off. This was rarely the case with samples containing a fully doped mirror. This effect occurs because the main charge carrying region of the top mirror does not come directly in contact with the charge-carrying region of the bottom mirror. A device can be fabricated with a bottom mirror that is doped only on the bottom half. This improves device reliability since concerns about over biasing the device are eliminated.

Figure 7A:
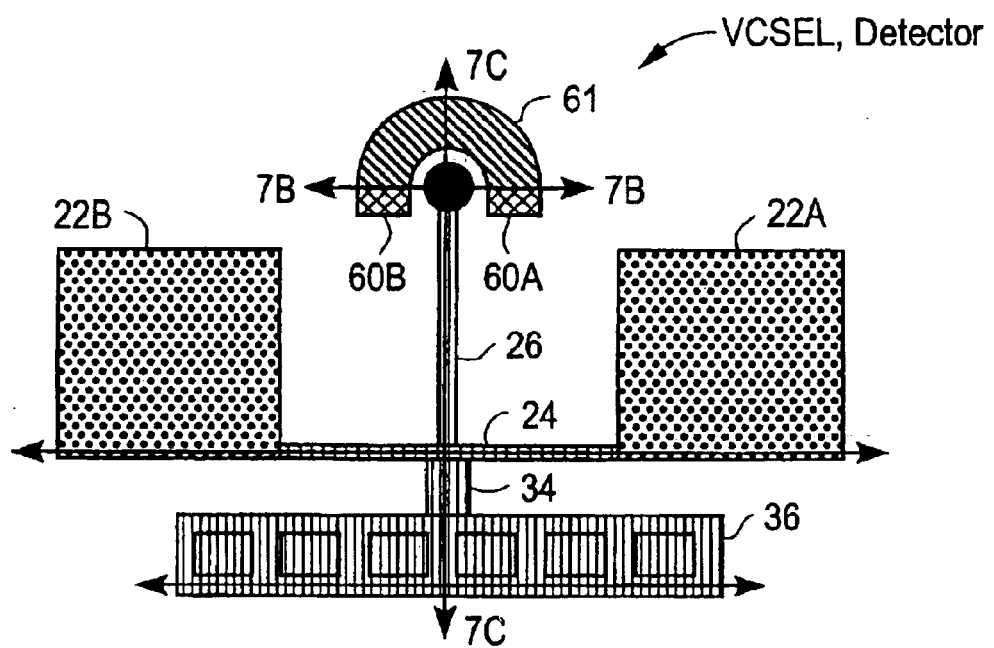
FIGS. 7A-7C illustrate an optical micro-electromechanical device in accordance with an alternative embodiment of the invention.

As previously indicated, the isolation region may also be in the form of a trench or other excavated surface. This implementation is shown in connection with FIGS. 7A-7C. FIG. 7A is a top view of an alternate embodiment of the invention, which includes a second set of contacts 60A–60B. The second set of contacts allow the device to be operate as a tunable vertical-cavity surface emitting laser (VCSEL) or a tunable detector. A metal layer 61 electrically connects the contacts 60A and 60B.

Figure 7B:
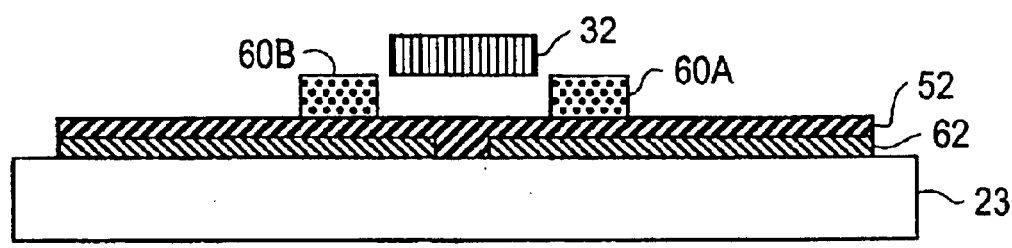

FIG. 7B is a side view taken along the line 7B—7B of FIG. 7A. The figure illustrates the second set of contacts 60A–60B and the bottom mirror 52, which has an associated oxidation layer 62.

Figure 7C:
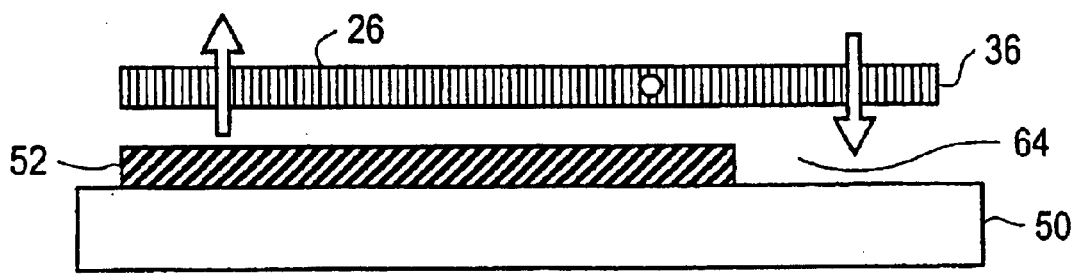

FIG. 7C is a side view taken along the line 7C–7C of FIG. 7A. FIG. 7C illustrates the bottom mirror 52 with an excavated region 64 beneath the counterweight 36. In this configuration, when the counterweight goes down completely, it does not directly contact an area that holds charge, and the device will not stick down. A passivation surface may also be used at the region under the counterweight 36. By way of example, the passivation surface may be silicon oxide, silicon nitride, un-doped silicon, or a polymer.

The structure of the invention has been described. In addition, techniques for fabricating the device have been described. Attention now turns to various ways of using the structure of the invention.

Optical filtering is often achieved through the use of a Fabry-Perot cavity. In its simplest form, a Fabry-Perot cavity consists of two mirrors separated by an air gap. This is convenient in a vertical-cavity configuration because epitaxial growth can provide mirrors and a sacrificial layer which can be etched away to form the air gap. For high-quality filter design, Distributed Bragg Reflectors (DBRs) are grown into the crystal to act as mirrors. These consist of alternating layers of high and low index of refraction materials with an optical thickness of one-quarter of the wavelength of interest.

Due to the multiple reflections in a DBR, the overall reflectivity is extremely high and increases with the number of layers. When working with GaAs substrates, it is easiest to grow layers with varying compositions of $Al_xGa_{1-x}As$. The refractive index varies from 3.54 at x=0 to 2.96 at x=1. Over the full range of compositions the change in lattice constant is small enough to allow for single-crystal growth. U.S. Pat. No. 6,026,108 entitled "Vertical-Cavity Surface-Emitting Laser with an Intracavity Quantum-Well Optical Absorber" describes the fabrication and use of DBRs. The teachings of the patent are incorporated by reference herein.

For a typical blue-shifting cantilever structure, there is a fundamental limit on the tuning range imposed by the actuation scheme. The cantilever can only reversibly tune over one-third of the gap. Any attempt to set the cantilever to a position beyond this will result in the cantilever slamming down onto the substrate and becoming stuck due to Van der Waals interactions. This is commonly known as the one-third rule. For simple cantilever structures, the one-third rule is the limiting factor of tuning range for a given free spectral range.

The present invention overcomes the one-third rule in tuning operations. The counterweight deflection is limited by the one-third rule as it travels toward the substrate. However, depending upon the mechanical properties of the overall structure, the total deflection of the mirror head may be greater than one-third of the gap. By using the mirror head as the top mirror of a Fabry-Perot cavity, the tuning range of the device is greater than that of a simple cantilever device. Another unique attribute of the invention is that for a set of Distributed Bragg Reflectors, the device will redshift or pass longer wavelengths with increased reverse-bias.

The critical operation of the counterweight suggests that a counterweight with as large an area as possible would be most desirable. Unfortunately, fabrication problems arise when the counterweight is too large. The reason for this is that there is a limit to the amount of undercut that can be achieved with the selective etch (eventually the sacrificial layer becomes passivated and unetchable). Limited undercut results in an unreleased device.

The invention relies upon the counterweight apertures 38 to overcome this problem. The holes 38 allow etchant to flow underneath a large structure to facilitate device release. With proper design, the etch holes only slightly impact the mechanical properties of the counterweight.

A simple measure of the quality of the device of the invention is the Twist Ratio (TR), which is defined as the ratio between the vertical deflection of the mirror head 32 and the vertical deflection of the counterweight 36. Maximizing this value will give the maximum tuning range for the mirror head. Any device with a Twist Ratio greater than 1.0 has the theoretical potential to tune further than a simple cantilever device.

FIG. 8 illustrates a table showing parameters associated with different embodiments of the invention. The parameters include mirror or cantilever width (mw), mirror length or cantilever length (ml), torsional beam width (cw), torsional beam length (cl), counterweight width (bw), counterweight length (bl), connector width (conn_w), connector length (conn_), device thickness (t), head diameter (d), gap size (g).

FIG. 8 illustrates that twist ratio increases linearly with device thickness. Increased head area, whether the head is circular or square, results in lower Twist Ratio. Gap size is shown to have no effect on Twist Ratio. This is significant because increasing gap size eases fabrication dramatically. Twist Ratio has a parabolic dependence on the remaining parameters, which makes optimization fairly easy to achieve. For instance, as mirror length is increased, at first the twist ratio increases due to a longer lever arm causing larger total deflection. As the mirror length is increased further it begins to bend towards the substrate. Thus, an optimal value lies somewhere between these lengths.

FIG. 8 also illustrates the dependence between the Twist Ratio and counterweight holes. The smaller the holes, the less effect they have. In order to insure that the holes are etched at the same rate as the rest of the device during the vertical plasma etch step, the holes are chosen to have a minimum dimension of 15 $\mu$m.

Figure 9:
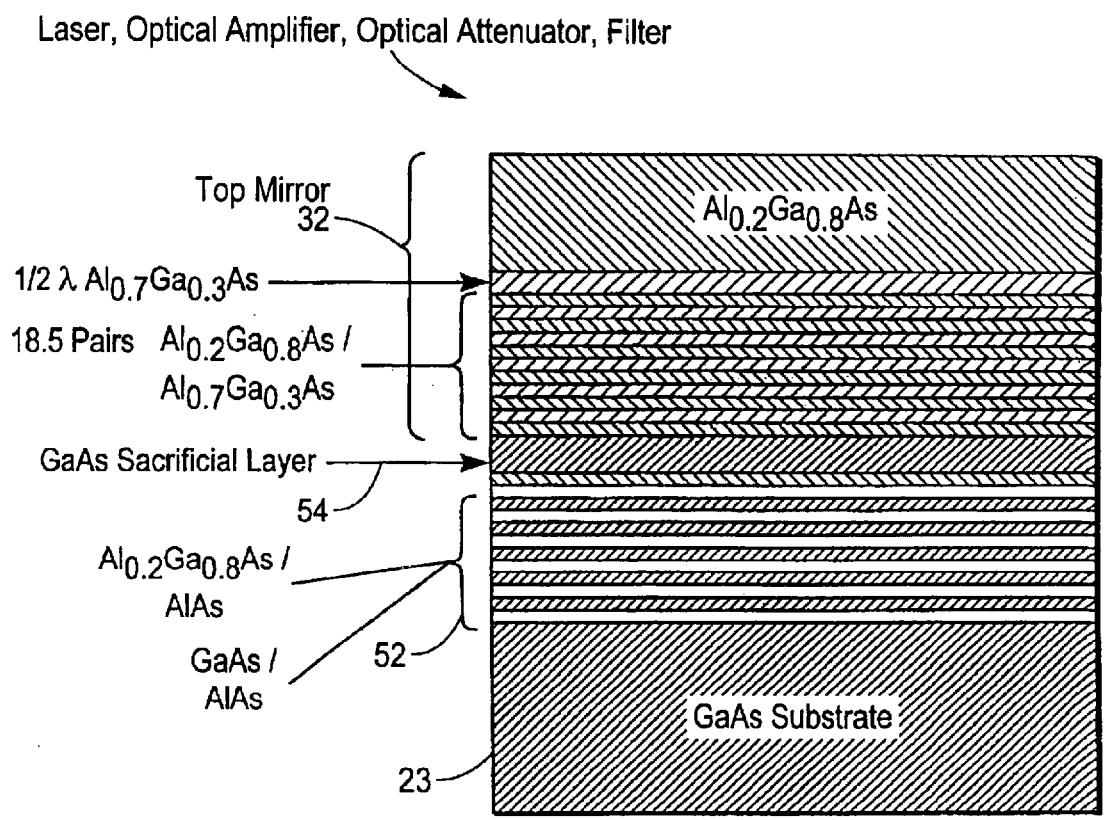
FIG. 9 illustrates a wafer that may be processed to form the apparatus of the invention.

The invention has been implemented with alternate wafer designs. The first design is a high-quality filter with DBR mirrors and narrow linewidth. The second is a simple three-layer structure with a large gap and low-finesse filtering characteristics. FIG. 9 illustrates a high-finesse cavity, MBE-grown wafer that may be processed to form the structure of the invention. The designed center filter wavelength is 950 nm. The wafer was grown using Molecular Beam Epitaxy (MBE) using Be for p-doping and Si for n-doping. It is grown on an n-type GaAs substrate. It is composed of 12 pairs of n-doped ¼ wavelength thick AlAs/GaAs layers followed by one AlAs/$Al_{0.2}Ga_{0.8}As$ layer pair to form the bottom mirror 52. Directly above this was grown an undoped 0.8 $\mu$m thick GaAs layer 54, which is to be etched away to form the air gap 64 (see also FIG. 7C). The top DBR is composed of 18.5 pairs of ¼ wavelength thick p-doped $Al_{0.2}Ga_{0.8}As/Al_{0.7}Ga_{0.3}As$ layers, followed by a ½ wavelength thick layer of p-doped $Al_{0.7}Ga_{0.3}As$. The top layer is a ¼ $\mu$m thick p-doped layer of $Al_{0.2}Ga_{0.8}As$. This layer was included to add stiffness to the mechanical structure and is referred to as the stiffening layer. The n-doping and p-doping were set at 1e18 $cm^{-3}$, with the exception of the top 0.1 $\mu$m of the stiffening layer, which was doped 1e19 $cm^{-3}$ to decrease contact resistance.

Figure 10:
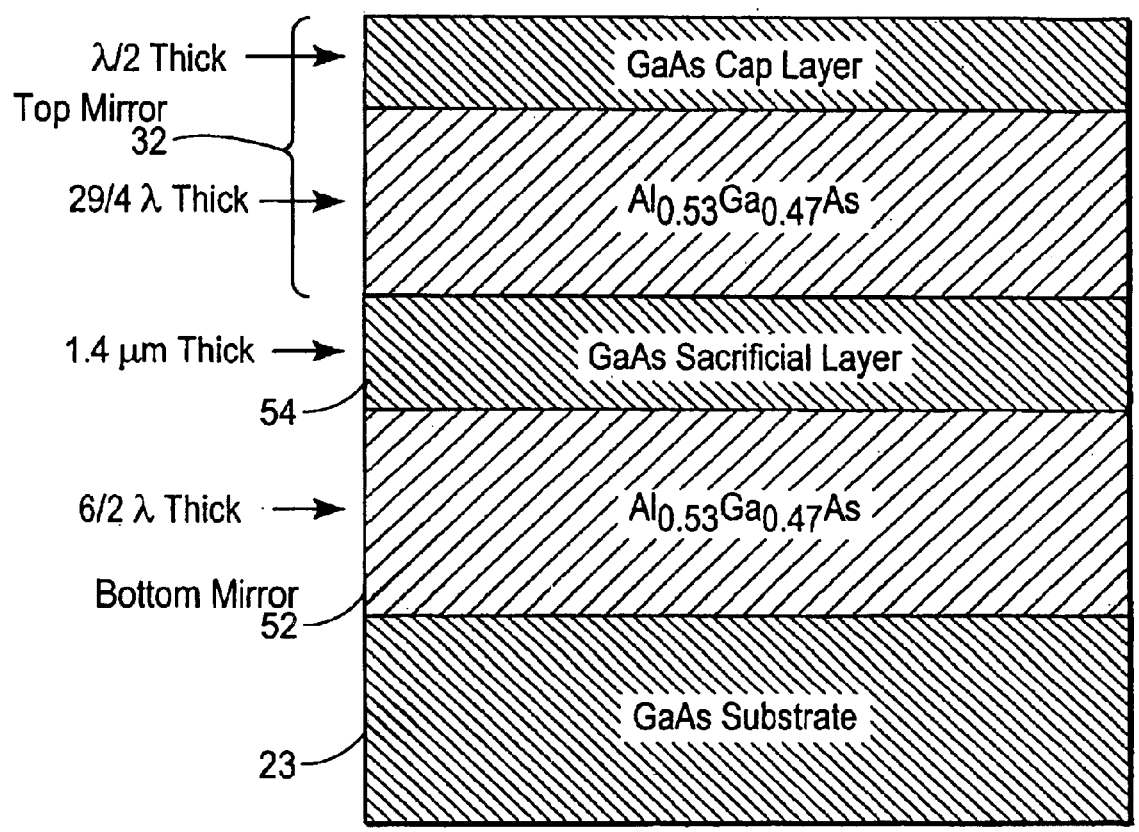
FIG. 10 illustrates another wafer that may be processed to form the apparatus of the invention.

FIG. 10 illustrates a low-finess cavity, MOCVD-grown wafer that may be used to fabricate the structure of the invention. The wager of FIG. 10 is designed to be measured at wavelengths in the range of 915 nm to 950 nm, with a nominal wavelength of 915 nm. The wafer was grown using Metal-Organic Chemical Vapor Deposition (MOCVD) on an n-type GaAs substrate. The first epitaxial layer is a 5/2 wavelength thick $Al_{0.53}Ga_{0.47}As$ layer n-doped at 1e18 cm$^{-3}$ forming bottom mirror 52. On top of this is the top mirror 32, a first portion of which is undoped GaAs sacrificial layer 54 with a thickness of 1.36 $\mu$m. Next is a 29/4 wavelength thick $Al_{0.53}Ga_{0.47}As$ layer. The upper half of this layer is doped p-type at 1e18 cm$^{-3}$, while the bottom half is undoped. On the top of the structure is a ½ wavelength thick GaAs cap layer doped at 1e19 cm$^{-3}$ to lower contact resistance.

Those skilled in the art will recognize a variety of modifications to the disclosed structure and processes that are within the scope of the invention. For example, the wafer of FIG. 9 may be modified to include a Lambda cavity above the first DBR pair that is on top of the GaAs substrate. Within the Lambda cavity is an active layer. On top of the Lambda cavity is an oxidation layer. An additional DBR pair is then positioned on the oxidation layer. The three DBR pairs are doped to provide an N—P—N or P—N—P structure. This configuration is used to form a laser. Previously cited U.S. Pat. No. 6,026,108 describes structures that may be utilized in accordance with the invention. A P—N junction may also be formed under the mirror head 32 to operate the device as an optical detector. Similar structural modifications may be utilized to operate the structure of the invention as an optical amplifier and an optical attenuator.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An optical micro-electromechanical device, comprising:
    a substrate; and
    a mirror assembly suspended above said substrate, said substrate and said mirror together forming a Fabry-Perot cavity, said mirror assembly including:
        a torsional beam attached to said substrate,
        a cantilever with a cantilever first end and a cantilever second end, said cantilever first end being attached to said torsional beam, said cantilever second end supporting a mirror head,
        a connector attached to said torsional beam, and
        a counterweight attached to said connector.

2. The optical micro-electromechanical device of claim 1 wherein said counterweight has a set of apertures formed therein.

3. The optical micro-electromechanical device of claim 2 wherein a region of said substrate under said counterweight is configured as an isolation region.

4. The optical micro-electromechanical device of claim 3 wherein said isolation region is doped to provide electrical isolation between said counterweight and said isolation region.

5. The optical micro-electromechanical device of claim 3 wherein said isolation region includes a deposited passivation surface.

6. The optical micro-electromechanical device of claim 3 wherein said isolation region includes a trench to facilitate spatial isolation between said isolation region and said counterweight.

7. The optical micro-electromechanical device of claim 2 configured as a laser.

8. The optical micro-electromechanical device of claim 1 configured as an optical detector.

9. The optical micro-electromechanical device of claim 1 configured as an optical filter.

10. The optical micro-electromechanical device of claim 1 configured as an optical amplifier.

11. The optical micro-electromechanical device of claim 1 configured as an optical attenuator.

12. A method of operating an optical micro-electromechanical device, said method comprising the steps of:
    positioning a mirror assembly over a substrate such that said substrate and said mirror together form a Fabry-Perot cavity, said mirror assembly including a torsional beam attached to said substrate, a cantilever with a cantilever first end and a cantilever second end, said cantilever first end being attached to said torsional beam, said cantilever second end supporting a mirror head, a connector attached to said torsional beam, and a counterweight attached to said connector; and
    applying an electrical bias to said substrate so as to create an electrostatic attraction between said counterweight and said substrate, which causes said torsional beam to rotate and thereby re-position said mirror head.

13. The method of claim 12 wherein said applying step includes the step of applying said electrical bias to said substrate so as to re-position said mirror head to create a red-shift of filter wavelength.

14. The method of claim 12 wherein said applying step includes the step of applying said electrical bias to said substrate so as to re-position said mirror head to create a blue-shift of filter wavelength.

15. The method of claim 12 wherein said positioning and applying steps are performed such that said mirror assembly operates as a laser.

16. The method of claim 12 wherein said positioning and applying steps are performed such that said mirror assembly operates as an optical detector.

17. The method of claim 12 wherein said positioning and applying steps are performed such that said mirror assembly operates as an optical filter.

18. The method of claim 12 wherein said positioning and applying steps are performed such that said mirror assembly operates as an optical amplifier.

19. The method of claim 12 wherein said positioning and applying steps are performed such that said mirror assembly operates as an optical attenuator.

20. The method of claim 12 further comprising the step of isolating said counterweight from said substrate.

21. The method of claim 20 wherein said isolating step includes the step of electrically isolating said counterweight from said substrate.

22. The method of claim 21 wherein said isolating step includes the step of electrically isolating said counterweight from said substrate through doping.

23. The method of claim 21 wherein said isolating step includes the step of electrically isolating said counterweight from said substrate with a passivation surface.

24. The method of claim 21 wherein said isolating step includes the step of spatially isolating said counterweight from said substrate.

25. An optical micro-electromechanical device, comprising:
   a substrate; and
   a mirror assembly suspended above said substrate, said substrate and said mirror together forming a Fabry-Perot cavity, said mirror assembly including:
      a torsional beam attached to said substrate,
      a cantilever with a cantilever first end and a cantilever second end, said cantilever first end being attached to said torsional beam, said cantilever second end supporting a mirror head, said cantilever having a first length measured from said cantilever first end to said cantilever second end,
      a connector attached to said torsional beam, and
      a counterweight with a counterweight first end and a counterweight second end, said counterweight first end being attached to said connector, said counterweight second end being suspended above the substrate, said counterweight having a second length measured from said counterweight first end to said counterweight second end, said second length being less than said first length.

26. The optical micro-electromechanical device of claim 25 wherein the mirror head comprises distributed Bragg reflectors.

27. The optical micro-electromechanical device of claim 25 wherein the substrate comprises distributed Bragg reflectors.

28. A method of operating an optical micro-electromechanical device, said method comprising the steps of:
   positioning a mirror assembly over a substrate such that said substrate and said mirror together form a Fabry-Perot cavity, said mirror assembly including:
      a torsional beam attached to said substrate, a cantilever with a cantilever first end and a cantilever second end, said cantilever first end being attached to said torsional beam, said cantilever second end supporting a mirror head, said cantilever having a first length measured from said cantilever first end to said cantilever second end,
      a connector attached to said torsional beam, and
      a counterweight with a counterweight first end and a counterweight second end, said counterweight first end being attached to said connector, said counterweight second end being suspended above the substrate, said counterweight having a second length measured from said counterweight first end to said counterweight second end, said second length being less than said first length; and
   applying an electrical bias to said substrate so as to create an electrostatic attraction between said counterweight and said substrate, which causes said torsional beam to rotate and thereby re-position and said mirror head.

* * * * *